(12) United States Patent
Thorp et al.

(10) Patent No.: US 7,558,129 B2
(45) Date of Patent: Jul. 7, 2009

(54) DEVICE WITH LOAD-BASED VOLTAGE GENERATION

(75) Inventors: Tyler Thorp, Sunnyvale, CA (US); Ken So, Belmont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 11/694,760

(22) Filed: Mar. 30, 2007

(65) Prior Publication Data
US 2008/0239802 A1  Oct. 2, 2008

(51) Int. Cl.
*G11C 5/14* (2006.01)

(52) U.S. Cl. .......................... 365/189.09; 365/189.07; 365/226

(58) Field of Classification Search ............ 365/189.09, 365/189.07, 210, 226, 230.06
See application file for complete search history.

(56) References Cited

U.S. PATENT DOCUMENTS

| | | | |
|---|---|---|---|
| 5,508,971 A | 4/1996 | Cernea et al. | |
| 5,563,825 A | 10/1996 | Cernea et al. | |
| 5,568,424 A | 10/1996 | Cernea et al. | |
| 5,592,420 A | 1/1997 | Cernea et al. | |
| 5,621,685 A | 4/1997 | Cernea et al. | |
| 5,693,570 A | 12/1997 | Cernea et al. | |
| 5,946,258 A * | 8/1999 | Evertt et al. | 365/226 |
| 6,134,145 A | 10/2000 | Wong | |
| 6,229,732 B1 * | 5/2001 | Lin et al. | 365/185.18 |
| 6,314,025 B1 | 11/2001 | Wong | |
| 6,370,075 B1 | 4/2002 | Haeberli et al. | |
| 6,385,086 B1 | 5/2002 | Mihara et al. | |
| 6,438,462 B1 | 8/2002 | Hanf et al. | |
| 6,486,728 B2 | 11/2002 | Kleveland | |
| 6,525,949 B1 | 2/2003 | Johnson et al. | |
| 6,556,465 B2 | 4/2003 | Haeberli et al. | |
| 6,577,535 B2 | 6/2003 | Pasternak | |
| 6,586,971 B1 | 7/2003 | Naffziger et al. | |
| 6,606,267 B2 | 8/2003 | Wong | |
| 6,693,412 B2 | 2/2004 | Ruan et al. | |
| 6,696,867 B2 | 2/2004 | Keith et al. | |
| 6,760,262 B2 | 7/2004 | Haeberli et al. | |
| 6,922,096 B2 | 7/2005 | Cernea | |

(Continued)

OTHER PUBLICATIONS

U.S. Appl. No. 11/618,539, entitled "Unified Voltage Generation apparatus with Improved Power Efficiency", filed Dec. 29, 2006.

(Continued)

*Primary Examiner*—Gene N. Auduong

(57) ABSTRACT

Method and device for providing voltage generation with load-based control are disclosed. The voltage generation can be provided within an electronic device, such as a memory system that provides data storage. In one embodiment, an electrical load imposed on a generated voltage can be monitored and used to dynamically control strength of the generated voltage. For example, for greater electrical loads, the generated voltage can be provided with a greater strength, and for lesser electrical loads, the generated voltage can be provided with a lesser strength. By compensating the generated voltage for the nature of the imposed electrical load, the generated voltage can be provided in a stable manner across a significant range of loads. In the case of a memory system, stability in the generated voltage provides for reduced voltage ripple and thus improved sensing margins. The voltage generation is well suited for use in portable memory products (e.g., memory cards) to generate one or more internal voltages.

32 Claims, 7 Drawing Sheets

U.S. PATENT DOCUMENTS

| | | |
|---|---|---|
| 6,937,948 B2 * | 8/2005 | Rajguru .................. 702/65 |
| 6,944,034 B1 | 9/2005 | Shteynberg et al. |
| 6,944,058 B2 | 9/2005 | Wong |
| 7,023,260 B2 | 4/2006 | Thorp et al. |
| 7,030,683 B2 | 4/2006 | Pan et al. |
| 7,049,802 B2 | 5/2006 | Ruan et al. |
| 7,075,276 B2 | 7/2006 | Morales |
| 7,113,023 B2 | 9/2006 | Cernea |
| 2003/0006650 A1 | 1/2003 | Tang et al. |
| 2005/0248386 A1 | 11/2005 | Pan et al. |
| 2005/0249022 A1 * | 11/2005 | Martines et al. ........ 365/230.06 |
| 2007/0126494 A1 | 6/2007 | Pan |
| 2007/0139099 A1 | 6/2007 | Pan |
| 2007/0139100 A1 | 6/2007 | Pan |
| 2007/0153589 A1 | 7/2007 | Tailliet et al. |
| 2007/0229149 A1 | 10/2007 | Pan et al. |
| 2008/0018377 A1 | 1/2008 | Chung |
| 2008/0024096 A1 | 1/2008 | Pan |

OTHER PUBLICATIONS

U.S. Appl. No. 11/694,798, entitled "Method for Load-Based Voltage Generation", filed Mar. 30, 2007.

U.S. Office Action for U.S. Appl. No. 11/694,798, mailed Aug. 7, 2008.

* cited by examiner

DEVICE WITH LOAD-BASED VOLTAGE GENERATION

CROSS-REFERENCE TO RELATED APPLICATION

This application is related to U.S. patent application Ser. No. 11/694,798, filed concurrently herewith, and entitled "METHOD FOR LOAD-BASED VOLTAGE GENERATION," which is hereby incorporated herein by reference.

BACKGROUND OF THE INVENTION

1. Field of the Invention

The invention relates to voltage generation and, more particularly, to voltage generation internal to memory systems.

2. Description of the Related Art

Memory cards are commonly used to store digital data for use with various products (e.g., electronics products). Examples of memory cards are flash cards that use Flash type or EEPROM type memory cells to store data. Flash cards have a relatively small form factor and have been used to store digital data for products such as cameras, hand-held computers, set-top boxes, hand-held or other small audio players/recorders (e.g., MP3 devices), and medical monitors. A major supplier of flash cards is SanDisk Corporation of Fremont, Calif.

FIG. 1 is a schematic diagram of a conventional voltage generation circuit 100. The conventional voltage generation circuit 100 can provide one or more generated voltages to a memory system that provides non-volatile data storage and represents, for example, a memory card (e.g., flash card). The voltage generation circuit 100 includes a charge pump circuit 102. The charge pump circuit 102 operates to boost a lower input voltage (Vin) to produce a higher output voltage (Vout). The output voltage (Vout) is coupled to a decoupling capacitor (Cd) 104. The output voltage is also coupled to a resistor divider 106. The resistor divider 106 divides the output voltage using resistors R1 and R2. A comparator 108 couples to the resistor divider 106 and to a reference voltage (Vref). The output of the comparator 108 is fed back to the charge pump circuit 102 so that the charge pump circuit 102 can regulate the output voltage such that it remains at a substantially constant voltage level.

An output voltage, such as generated by the voltage generation circuit 100, can be supplied to a memory array that provides data storage. Typically, the voltage generation circuitry and the memory array are part of a memory system (or memory device). The memory array includes a plurality of memory elements. The memory elements are, for example, non-volatile memory elements. One of various implementations for a non-volatile memory element is a diode or antifuse type memory element. The various memory elements within the memory array can be accessed by way of bitlines and wordlines. When programming a memory element, a voltage is applied across the memory element to invoke a physical characteristic change in the memory element. As an example, when the memory element corresponds to a diode or antifuse type device, the programming of the memory element is referred to as "popping" or "blowing" the diode or antifuse. Unfortunately, however, such memory elements present current leakage paths that are temperature sensitive. Conventionally, voltage generation circuits (namely, charge pump circuits) are designed to accommodate near worst-case temperature scenarios. As a result, voltage generation circuits tend to produce significant voltage ripple or voltage overshoot across an operating temperature range. The undesired voltage ripple degrades data sensing margins with respect to reading or writing data to memory elements. The voltage ripple or voltage overshoots are particularly problematic at lower temperature ranges where loading tends to be lower. Accordingly, there is a need for improved voltage generation for memory systems.

SUMMARY OF THE INVENTION

The invention relates to voltage generation with load-based control for use within an electronic device, such as a memory system that provides data storage. In one embodiment, an electrical load imposed on a generated voltage can be monitored and used to dynamically control strength of the generated voltage. For example, for greater electrical loads, the generated voltage can be provided with a greater strength, and for lesser electrical loads, the generated voltage can be provided with a lesser strength. By compensating the generated voltage for the nature of the imposed electrical load, the generated voltage can be provided in a stable manner across a significant range of loads. In the case of a memory system, stability in the generated voltage provides for reduced voltage ripple and thus improved sensing margins.

The invention can be implemented in numerous ways, including as a method, system, device or apparatus. Several embodiments of the invention are discussed below.

As a memory device, one embodiment of the invention includes at least: a voltage generation circuit capable of receiving an input voltage and producing an output voltage that is greater than the input voltage; a memory array including a plurality of non-volatile memory elements; and a load monitor configured to monitor a load imposed on the voltage generation circuit by the memory array. The voltage generation circuit produces the output voltage at a controllable strength, and the strength of the output voltage from the voltage generation circuit is limited dependent on the load monitored by the load monitor.

As a memory device, another embodiment of the invention includes at least: a voltage generation circuit capable of receiving an input voltage and producing an output voltage that is greater than the input voltage, and a memory array including a plurality of non-volatile memory elements. The voltage generation circuit including at least: a feedback circuit for regulating the output voltage being produced; a multi-stage charge pump capable of producing the output voltage; and a charge pump strength controller configured to control a strength at which the output voltage is produced by the multi-stage charge pump.

As an electronic system, one embodiment of the invention includes at least: a data acquisition device, and a data storage device removably coupled to the data acquisition device. The data storage device configured to store data acquired by the data acquisition device. The data storage device can include at least: a voltage generation circuit capable of receiving an input voltage and producing an output voltage that is greater than the input voltage; an array of data storage elements operatively connected to the voltage generation circuit; and a load monitor configured to monitor a load imposed on the voltage generation circuit by the array. The voltage generation circuit produces the output voltage at a controllable strength, and the strength of the output voltage from the voltage generation circuit is limited dependent on the load monitored by the load monitor.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to voltage generation with load-based control for use within an electronic device, such as a memory system that provides data storage. In one embodiment, an electrical load imposed on a generated voltage can be monitored and used to dynamically control strength of the generated voltage. For example, for greater electrical loads, the generated voltage can be provided with a greater strength, and for lesser electrical loads, the generated voltage can be provided with a lesser strength. By compensating the generated voltage for the nature of the imposed electrical load, the generated voltage can be provided in a stable manner across a significant range of loads. In the case of a memory system, stability in the generated voltage provides for reduced voltage ripple and thus improved sensing margins.

Voltage generation according to one embodiment of the invention is well suited for use in a portable memory product. For example, voltage generation can be provided within a portable data storage device (e.g., memory card or other compact modular memory device) to generate one or more internal voltages. More generally, voltage generation can be provided in an integrated circuit product.

Embodiments of the invention are discussed below with reference to FIGS. 2-8. However, those skilled in the art will readily appreciate that the detailed description given herein with respect to these figures is for explanatory purposes as the invention extends beyond these limited embodiments.

Figure 1:
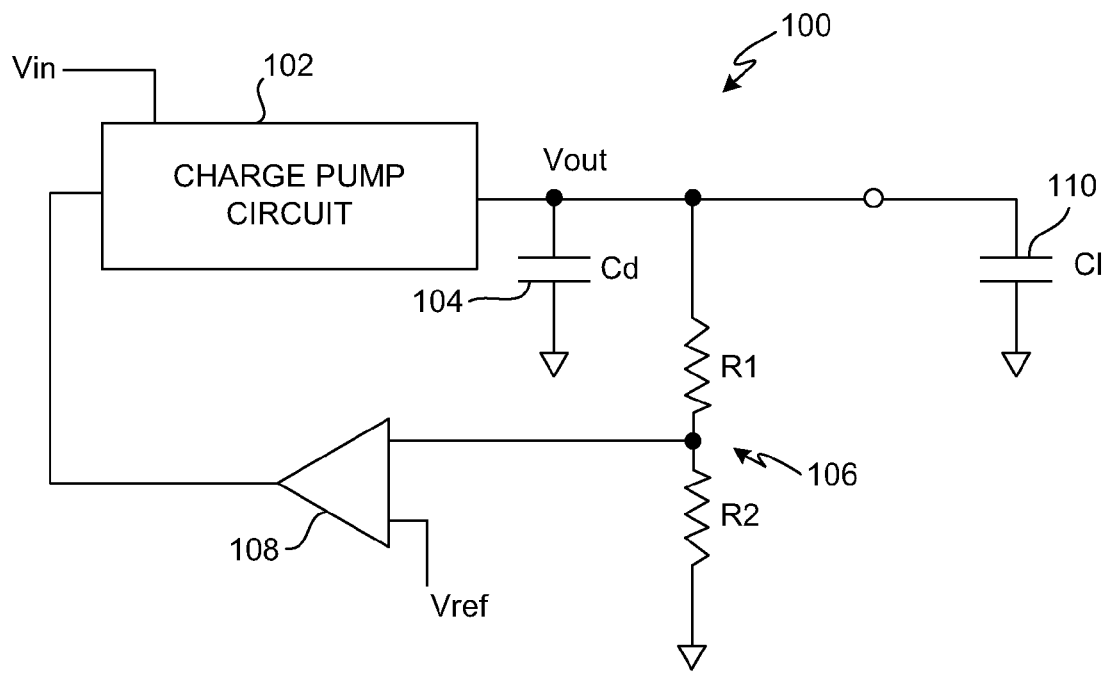
FIG. 1 is a schematic diagram of a conventional voltage generation circuit.
Figure 2:
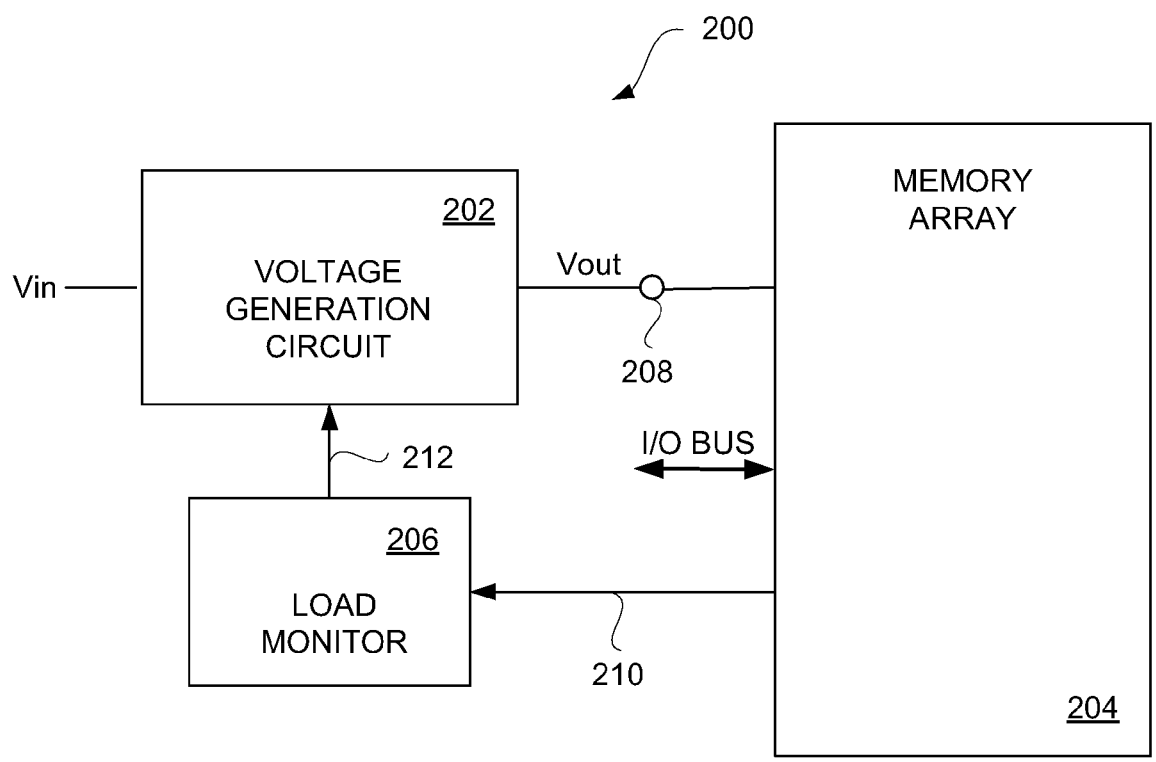
FIG. 2 is a block diagram of a memory device according to one embodiment of the invention.

FIG. 2 is a block diagram of a memory device 200 according to one embodiment of the invention. The memory device 200 includes a voltage generation circuit 202, a memory array 204, and a load monitor 206. The voltage generation circuit 202 receives an input supply voltage (Vin) and generates an output voltage (Vout) at output terminal 208. The output voltage (Vout) is at a higher voltage level than the input voltage (Vin) due to the voltage generation circuit 202 operating to boost the voltage level. In one embodiment, the input voltage (Vin) is "pumped up" by a charge pump within the voltage generation circuit 202 to produce the output voltage (Vout). The output voltage (Vout) can be referred to as a regulated voltage since the voltage generation circuit 202 operates to monitor the output voltage (Vout). The regulation can be implemented by a feedback loop that attempts to maintain the output voltage (Vout) at a constant voltage level.

The memory array 204 receives the output voltage (Vout) by connecting to the output terminal 208. The output voltage (Vout) is used to provide power to the memory array 204. Other circuitry that is or can couple to the memory device 200 can access data that is stored in or to be stored in the memory array 204 via an Input/Output (I/O) bus.

During operation of the memory device 200, the memory array 204 acts as a load on the output voltage (Vout). In such case, the memory array 204 imposed an electrical load on the output voltage (Vout) from the output terminal 208. In one embodiment, the electrical load refers to a current load. The electrical load imposed on the output voltage (Vout) by the memory array 204 varies while in use. In one embodiment, the electrical load imposed on the output voltage (Vout) is dependent upon the temperature of the memory array 204. The temperature is thus an indication of an electrical load being imposed by the memory array 204 on the output voltage (Vout). Hence, temperature is one characteristic of the memory array 204 that can be used to determine the electrical load imposed on the output voltage (Vout). However, other characteristics can alternatively or additionally be evaluated to obtain an indication of the electrical load imposed on the output voltage (Vout). In this regard, the load monitor 206 can receive a load characteristic 210 from the memory array 204. The load monitor 206 can then evaluate the load characteristic 210 and produce one or more control signals 212 that are supplied to the voltage generation circuit 202. The voltage generation circuit 202 can then alter its configuration and/or operation to adequately and reliably support the load being imposed on the generated output voltage (Vout).

Typically, in data storage devices, such as FLASH memory or EEPROM devices, a plurality of different voltage levels are used internally to support various operations (e.g., read, program and erase). These different voltage levels can be generated or derived from the output voltage (Vout) at the voltage generation circuit 202 or the memory array 204.

The memory array 204 include a plurality of memory elements. The memory elements can relate to a non-volatile memory cells (i.e., memory cells whose data is not lost or altered when electrical power is removed). Although any suitable memory array can be used, in one embodiment, the memory array 204 is part of a three-dimensional memory array, which can provide economies in terms of reduced size and associated reductions in manufacturing cost. In one implementation, the memory array 204 can include a vertical array of layers as memory cells. In one embodiment, the memory cells are field-programmable. A field-programmable memory cell is a memory cell that is fabricated in an initial, un-programmed digital state and can be switched to an alternative, programmed digital state at a time after fabrication.

Although any suitable type of memory cells can be used, in one embodiment, the memory cells are a write-once memory cell comprising an antifuse and a diode, for example as described in U.S. Pat. No. 6,034,882 and U.S. Pat. No. 6,515,888, both of which are hereby incorporated by reference. In its un-programmed state, the antifuse is intact, and the memory cell holds a Logic 1. When suitable voltages are applied to the appropriate wordline and bitline, the antifuse of the memory cell is blown, and the diode is connected between the wordline and the bitline. This places the memory cell in a programmed (Logic 0) state. Alternatively, the un-programmed state of the memory cell can be Logic 0, and the programmed state can be Logic 1. Memory cells that support multiple programmed states can also be used. Being write-once, the initial, un-programmed digital state cannot be restored once the memory cell is switched to the programmed digital state. Instead of being write-once, the memory cells can be write-many (re-writeable). Unlike the digital state of a write-once memory cell, the digital state of a write-many memory cell can be switched between "un-programmed" and "programmed" digital states. When referring to write-many memory cells, the un-programmed digital state refers to the digital state of the memory cell before a programming operation. Accordingly, the un-programmed digital state can refer to either Logic 0 or Logic 1 (in a two-state memory cell) and does not necessarily refer to the digital state in which that memory cell was fabricated.

Figure 3:
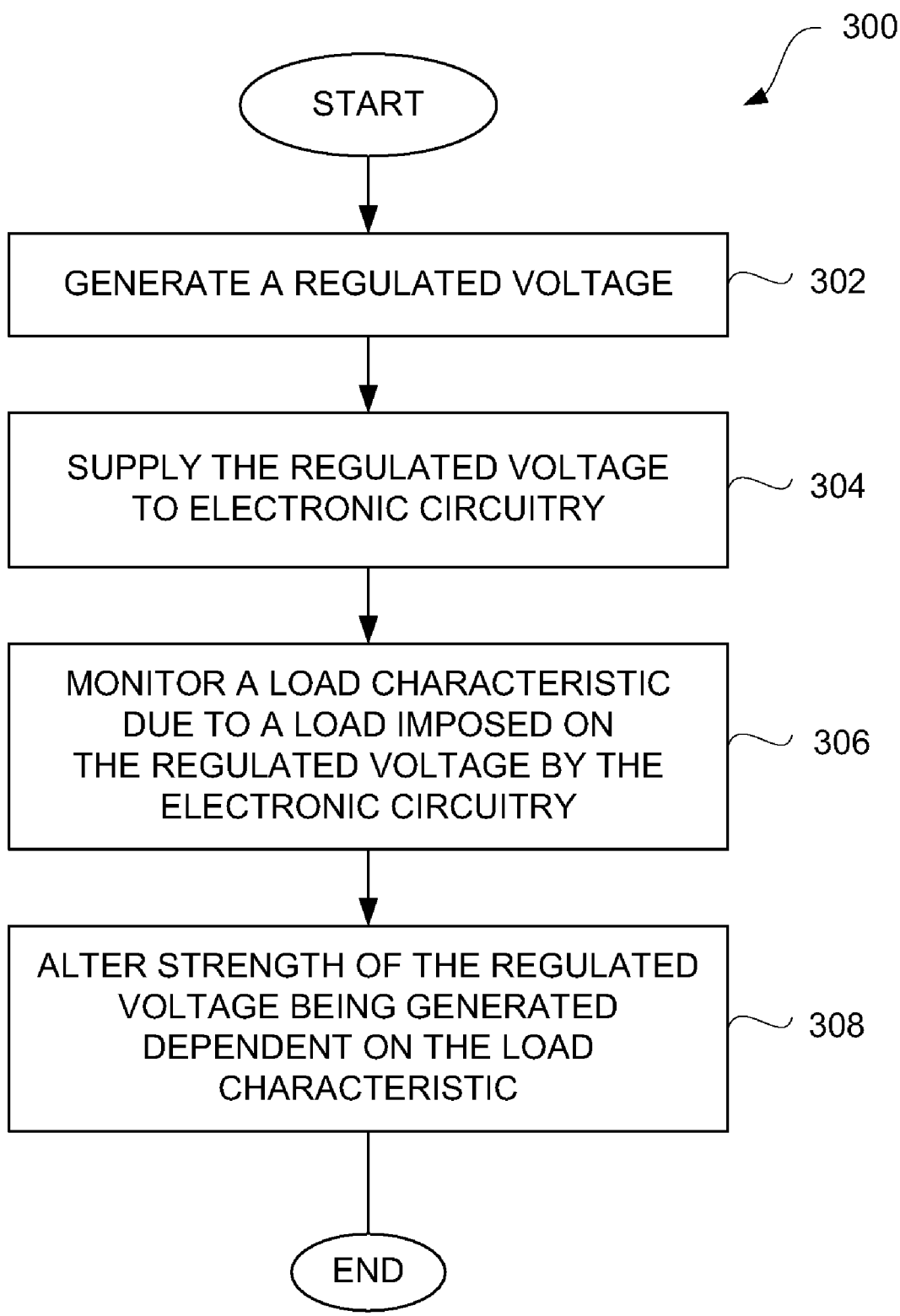
FIG. 3 is a flow diagram of a voltage generation process according to one embodiment of the invention.

FIG. 3 is a flow diagram of a voltage generation process 300 according to one embodiment of the invention. The voltage generation process 300 is, for example, performed by an electronic device. The electronic device can be an integrated circuit product. One example of an integrated circuit product is a memory device, such as the memory device 200 illustrated in FIG. 2.

The voltage generation process 300 can generate 302 a regulated voltage. Typically, the regulated voltage is a higher voltage then a supply voltage that is utilized in producing the regulated voltage. Once the regulated voltage is generated 302, the regulated voltage can continue to be regulated so that it is maintained at a generally consistent voltage level. After the regulated voltage has been generated 302, the regulated voltage can be supplied 304 to electronic circuitry. When the voltage generation process is performed by a memory device, the electronic circuitry is electronic circuitry provided within the memory device. For example, the electronic circuitry can be associated with a memory array provided within the memory device. The electronic circuitry that utilizes the regulated voltage imposes an electrical load on the regulated voltage. Normally, the electrical load changes over time and causes the regulated voltage to compensate for the changes in the electrical load so that the output voltage level remains generally level.

Next, a load characteristic due to the electrical load imposed on the regulated voltage by the electronic circuitry is monitored 306. The load characteristic is a characteristic of the electrical load that provides an indication of the degree of the electrical load being imposed. Thereafter, the strength of the regulated voltage being generated can be altered 308 dependent on the load characteristic. For example, when the load characteristic indicates that the electrical load imposed on the regulated voltage is determined to be high, then the strength of the regulated voltage can be increased, whereas when the load characteristic indicates that the electrical load imposed on the regulated voltage is determined to be low, the strength of the regulated voltage can be lowered. After the strength of the regulated voltage has been altered 308 as is appropriate given the electrical load, the voltage generation process 300 can end. However, it should be understood that the voltage generation process 300 is typically a continuous process that serves to provide a regulated voltage to the electronic circuitry. By monitoring the load characteristic, the strength of the regulated voltage can be dynamically altered to compensate for different levels of loading that can be imposed on the regulated voltage.

Figure 4:
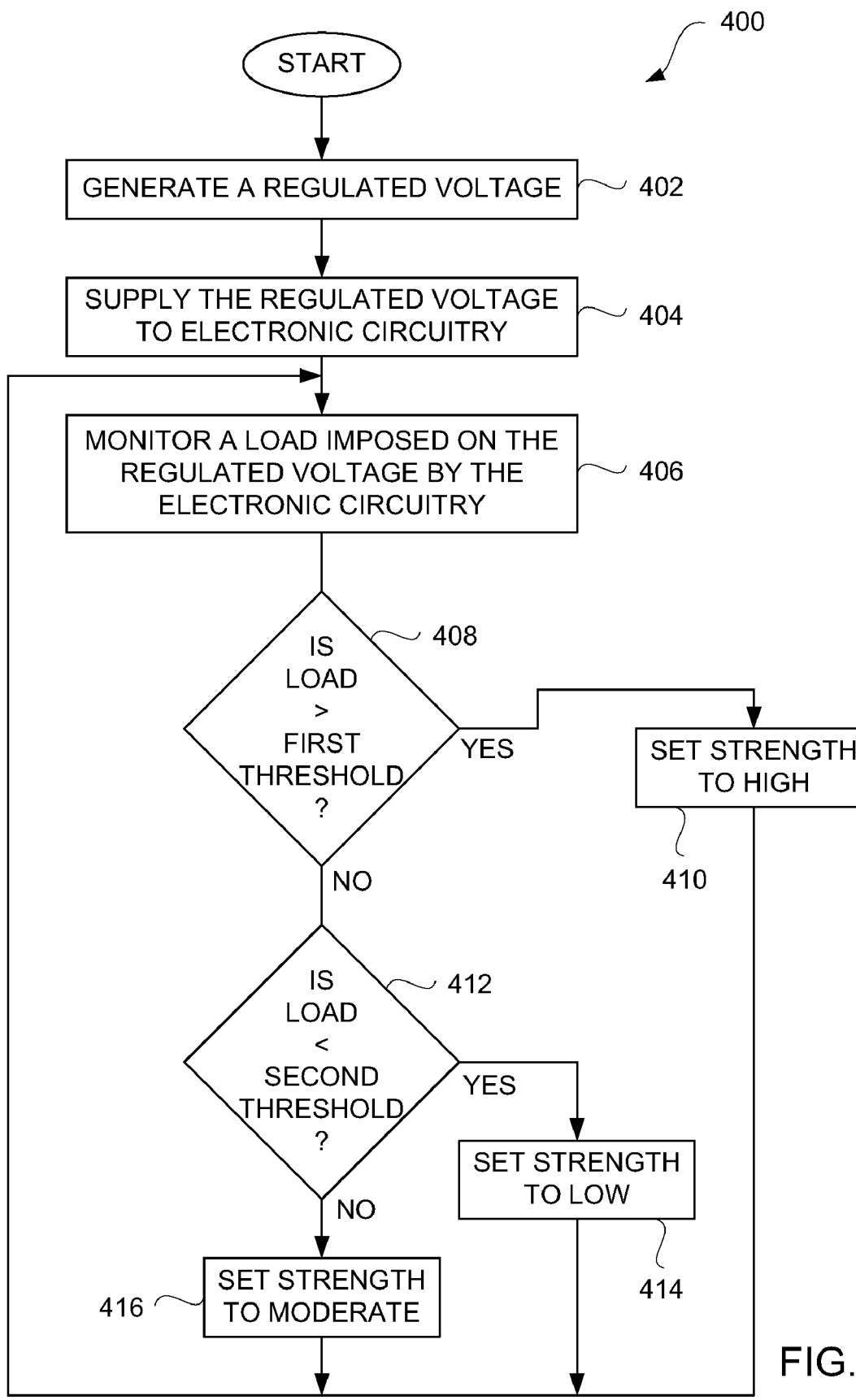
FIG. 4 is a flow diagram of a voltage generation process according to another embodiment of the invention.

FIG. 4 is a flow diagram of a voltage generation process 400 according to another embodiment of the invention. The voltage generation process 300 is, for example, performed by an electronic device. The electronic device can be an integrated circuit product. One example of an integrated circuit product is a memory device, such as the memory device 200 illustrated in FIG. 2.

The voltage generation process 400 can initially generate 402 a regulated voltage. The regulated voltage can then be supplied 404 to electronic circuitry. For example, the electronic circuitry can be provided by an integrated circuit product, such as memory device.

Next, an electrical load (e.g., current load) imposed on the regulated voltage by the electronic circuitry is monitored 406. A decision 408 then determines whether the load is greater than a first threshold. When the decision 408 determines that the load is greater than the first threshold, then the strength of the regulated voltage can be set 410 too "high". The operation to set 410 the strength to "high" can involve generating the regulated voltage at a greater strength at the voltage generation circuitry. In the event that the strength of the regulated voltage is already set to "high", then the block 410 can result in no net change in strength.

On the other hand, when the decision 408 determines that the load is not greater than the first threshold, a decision 412 determines whether the load is less than a second threshold. The second threshold is a threshold level that is below the first threshold level. When the decision 412 determines that the load is less than the second threshold, then the strength of the regulated voltage can be set 414 to "low". The operation to set 414 the strength to "low" can involve generating the regulated voltage at a lesser strength at the voltage generation circuitry. Alternatively, when the decision 412 determines that the load is not less than the second threshold, then the strength of the regulated voltage being produced can be set 416 to "moderate". Following the blocks 410, 414 or 416, the voltage generation process 400 can return to repeat the block 406 and subsequent blocks so that monitoring and strength adjustment can be continuously and dynamically performed. Accordingly, as the load imposed on a regulated voltage changes, the associated strength at which the regulated voltage is produced can change in a commensurate fashion. Consequently, the regulated voltage is able to be produced in a more stable and consistent manner.

Figure 5:
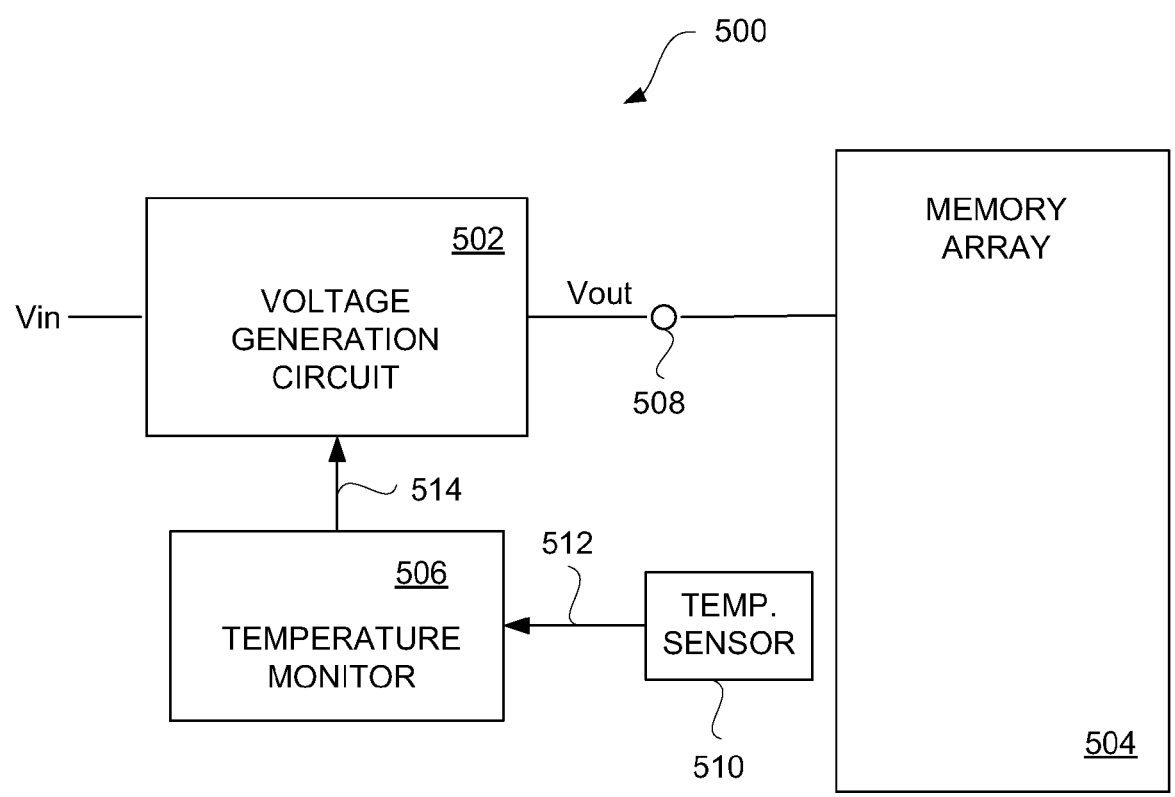
FIG. 5 is a block diagram of a memory device according to another embodiment of the invention.

FIG. 5 is a block diagram of a memory device 500 according to another embodiment of the invention. The memory device 500 includes a voltage generation circuit 502, a memory array 504, and a temperature monitor 506. The voltage generation circuit 502 receives an input voltage (Vin) and outputs an output voltage (Vout) at output terminal 508. The output voltage (Vout) is at a higher voltage level than the input voltage (Vin). The output voltage (Vout) at the output terminal 508 is supplied to the memory array 504. The memory array 504 imposes an electrical load on the output voltage (Vout). In this embodiment, a temperature sensor 510 is provided proximate to the memory array 504. In another embodiment, the temperature sensor 510 could be located within the memory array 504. In still another embodiment, the temperature sensor 510 can within the same integrated circuit chip as the memory array 504. The temperature sensor 510 is used to sense the temperature at or near the memory array 504. The temperature sensor 510 supplies a temperature indication 512 to the temperature monitor 506. In this embodiment, it is assumed that the memory element 504 has a temperature-dependent load. For example, diode or antifuse type memory elements experience such a temperature dependency. The temperature indication 512 thus serves as an indirect indication of the current load being imposed on the output voltage (Vout) at the output terminal 508 of the voltage generation circuit 502. The temperature monitor 506 can produce a control signal 514 that is supplied to the voltage generation circuit 502. The control signal 514 is dependent upon the temperature indication 512 and can be used to control the voltage generation circuit 502 to produce the output voltage (Vout) at different strength levels.

In one embodiment, when the temperature indication 512 provided by the temperature sensor 510 indicates that the memory array 504 is at an elevated temperature, the temperature monitor 506 can produce the control signal 514 so to cause the voltage generation circuit 502 to increase the strength of the output voltage (Vout). Hence, since the elevated temperature at the memory array 504 indirectly indicates that the current load being imposed on the output voltage (Vout) is high, the temperature monitor 506 can produce the control signal 514 to cause the voltage generation circuit 502 to produce the output voltage at a greater strength level so that it can adequately support the increased current load being imposed by the memory array 504. On the other hand, when the temperature indication 512 provided by the temperature sensor 510 indicates that the memory array 504 is at a reduced temperature, the temperature monitor 506 can produce the control signal 514 so to cause the voltage generation circuit 502 to reduce the strength of the output voltage (Vout). With the reduced strength, the output voltage from the voltage generation circuit 502 can be regulated in a more stable and reliable manner. Improved regulation of the output voltage (Vout) also makes operation of the memory device 500, namely, operation of the memory array 502, more stable and reliable.

Figure 6:
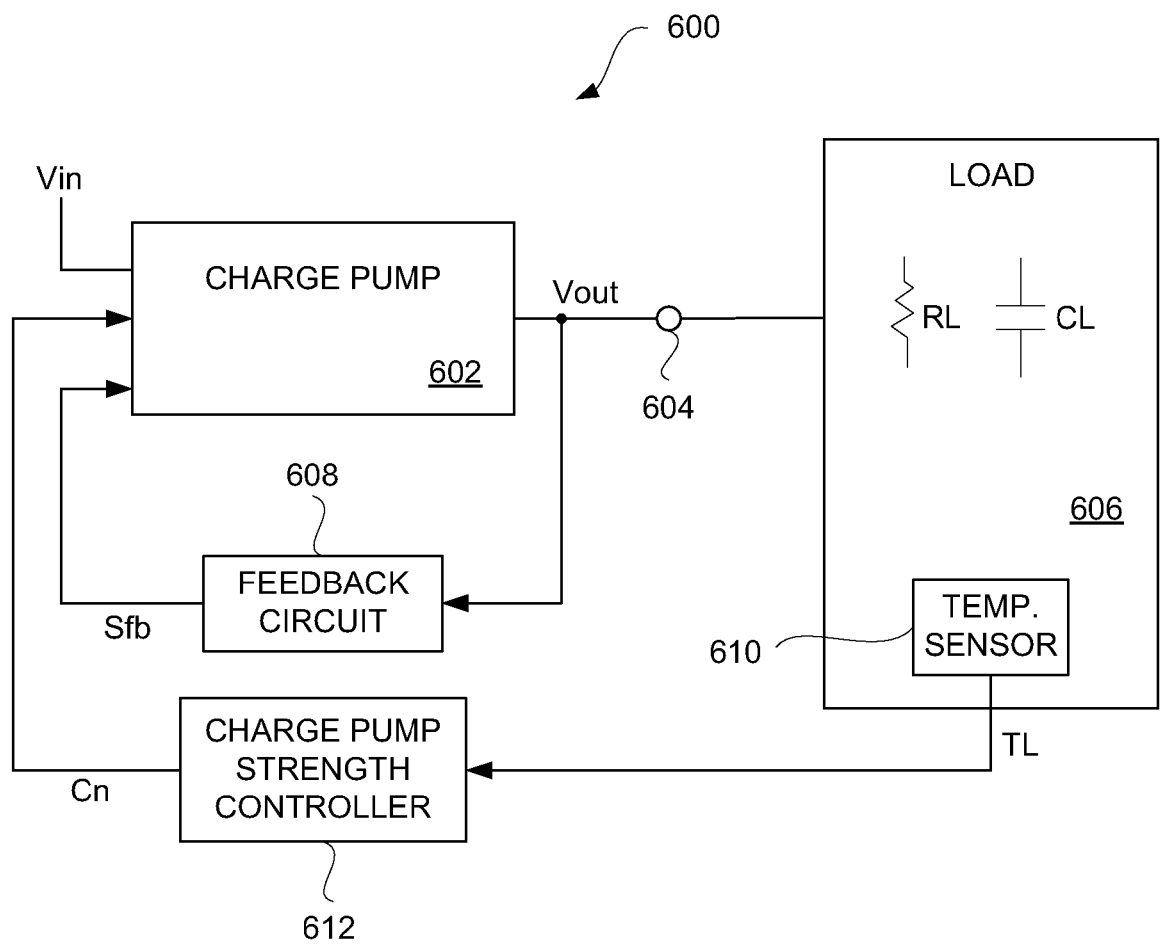
FIG. 6 is a block diagram of an electronic device according to one embodiment of the invention.

FIG. 6 is a block diagram of an electronic device 600 according to one embodiment of the invention. The electronic device 600 includes, among other circuitry, a charge pump 602 that receives an input voltage (Vin) and produces an output voltage (Vout). The output voltage (Vout) is provided in an output terminal 604 of the charge pump 602. The charge pump 602 can be a single-stage charge pump or a multi-stage charge pump. The output voltage (Vout) produced by the charge pump 602 can be supplied to a load 606. The load 606 is electronic circuitry that utilizes the output voltage (Vout). The load 606 generally includes a resistive load component (RL) and a capacitive load component (CL). The load 606 can also include a temperature sensor 610. The temperature sensor can produce a load temperature indication (TL) that can be supplied to a charge pump strength controller 612. The charge pump strength controller 612 can receive the load temperature indication (TL) and produce one or more control signals (Cn) that are supplied to the charge pump 602. The control signals (Cn) can control the charge pump 602 in various different ways to cause the charge pump 602 to operate at different strength levels. In one embodiment, the charge pump 602 includes a plurality of stages. By controlling which of the one or more stages within the charge pump 602 that are activated, the strength of the charge pump 602 can be controlled.

The electronic device 600 also includes a feedback circuit 608. The feedback circuit 608 is coupled to the output terminal 604 of the charge pump 602 and compares the output voltage (Vout) with a reference voltage level and produces a feedback signal (Sfb) that is supplied to the charge pump 602. Using the feedback signal (Sfb), the charge pump 602 can regulate the output voltage (Vout) such that it is produced at a generally consistent voltage level.

Figure 7A:
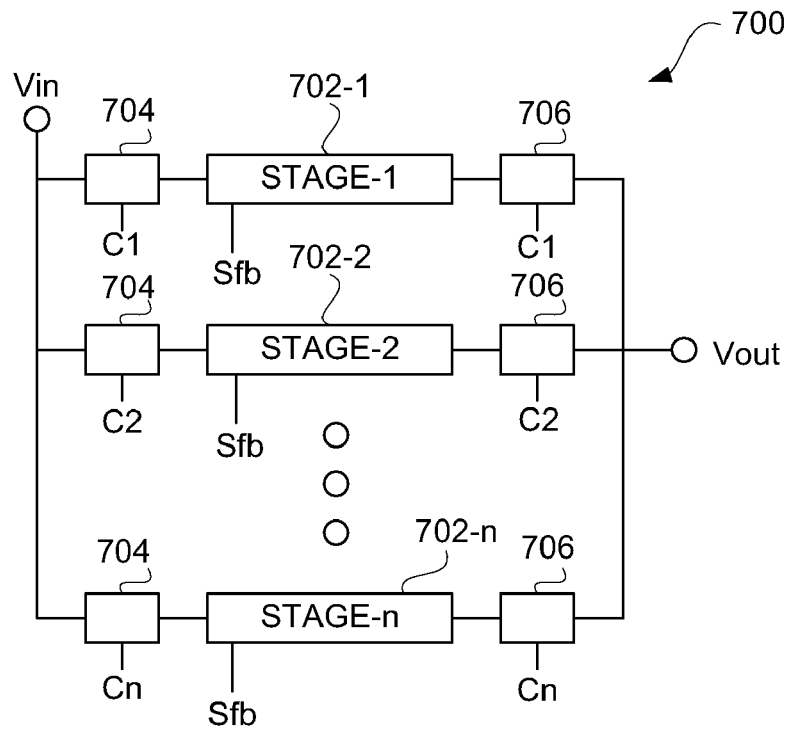
FIGS. 7A and 7B are block diagrams of exemplary multi-stage charge pump circuits that permit the multiple stages to be individually enabled or disabled.
Figure 7B:
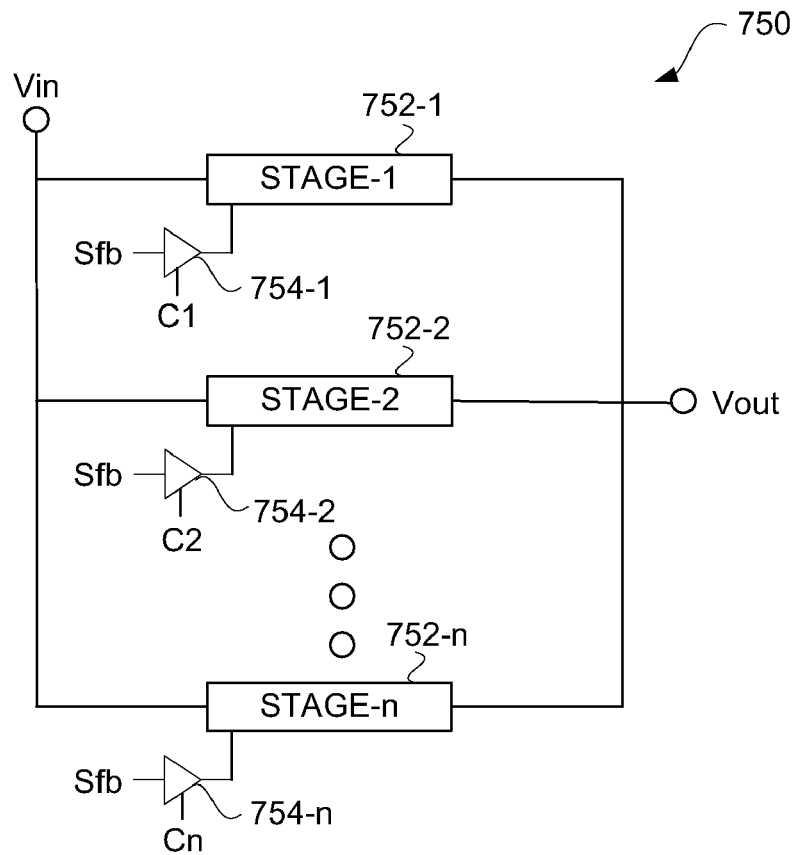

FIGS. 7A and 7B are block diagrams of exemplary multi-stage charge pump circuits that permit the multiple stages to be individually enabled or disabled.

FIG. 7A illustrates a charge pump 700 according to one embodiment of the invention. The charge pump 700 can, for example, be utilized as the charge pump 602 illustrated in FIG. 6.

The charge pump 700 includes a plurality of stages, including stage-1 702-1, stage-2 702-2, . . . , stage-n 702-n. Each of these stages 702 receives the input voltage via an input switch 704. The input switches 704 for each of the stages 702 can be respectively controlled by one of the control signals C1, C2, . . . , Cn. In addition, each of the stages 702 also receives a feedback signal (Sfb) provided by a feedback circuit. Still further, the stages 702 are coupled to the output of the charge pump 700 by output switches 706. The output switches 706 are respectively controlled by one of the control signal C1, C2, . . . , Cn. A charge pump strength controller, such as the charge pump strength controller 612 illustrated in FIG. 6, can produce the control signals C1, C2, . . . , Cn which are used to control the input switches 704 and the output switches 706. By controlling of the input switches 704 and the output switches 706, each of the stages of the charge pump 700 can be selectively enabled or disabled. In other words, by controlling the input switches 704 and the output switches 706, a particular stage 702 can be coupled between the input voltage (Vin) and the output voltage (Vout). The more of the stages 702 that are coupled between the input voltage (Vin) and the output voltage (Vout), the greater the strength of the charge pump 700.

FIG. 7B is a block diagram of a charge pump 750 according to another embodiment of the invention. The charge pump 750 can, for example, also be utilized as the charge pump 602 illustrated in FIG. 6. The charge pump 750 includes a plurality of stages 752. The plurality of stages 752 include stage-1 752-1, stage-2 752-2, . . . , stage-n 752-n. Each of the stages 752 receives an input voltage (Vin) and produces an output voltage (Vout). The output voltage (Vout) from all of the stages 752 that are activated are combined to produce the output voltage (Vout) for the charge pump 750. The more of the stages 752 that are activated, the greater the strength of the output voltage (Vout). To control whether the particular stages 752 within the charge pump 750 are active, the charge pump 750 includes a plurality of control gates 754. For example, the control gates 754 can be switchable buffers or logical AND gates. The control gate 754-1 is used to control the stage-1 752-1. The control gate 754-1 receives the feedback signal (Sfb) and the control signal C1. When the control signal C1 causes the control gate 754-1 to pass the feedback signal (Sfb) to the stage-1 752-1, the stage-1 752-1 would be active to produce an output voltage. Similarly, the control gate 754-2, . . . , 754-n are respectively controlled by control signals C2, . . . , Cn.

Figure 8:
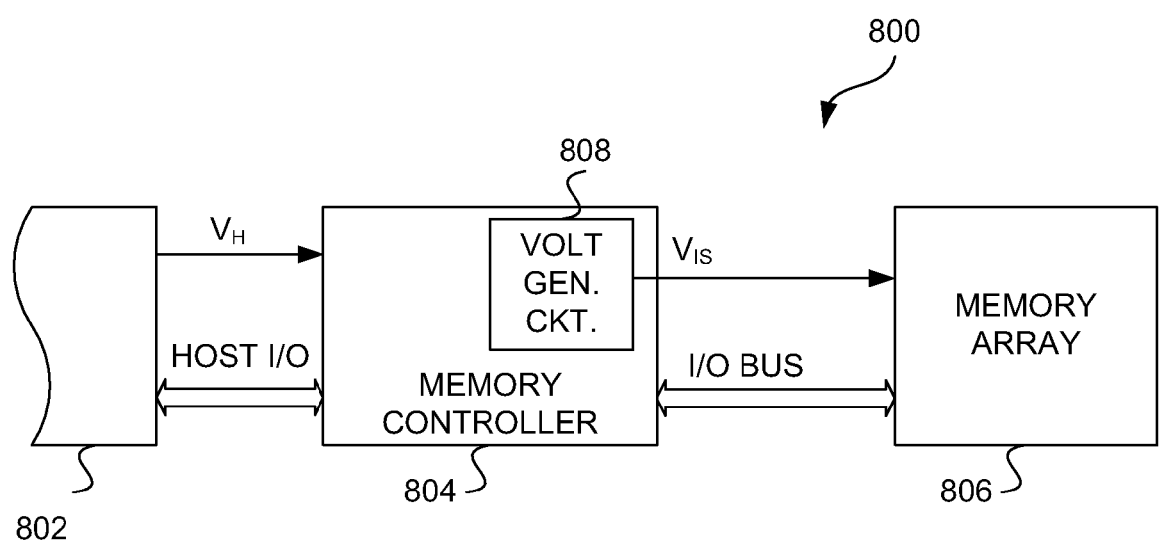
FIG. 8 is a block diagram of a memory system according to one embodiment of the invention.

FIG. 8 is a block diagram of a memory system 800 according to one embodiment of the invention. The memory system 800 is, for example, associated with a memory card (such as a plug-in card), a memory stick, or some other data storage product. Examples of a memory card include PC Card (formerly PCMCIA device), Flash Card, Flash Disk, Multimedia Card, and ATA Card. The memory system 800 can also be referred to as a memory product or a removable data storage product or a portable data storage product.

The memory system 800 cooperates with a host 802. For example, the host 802 can be a computing device, such as a personal computer. In particular, the memory system 800 stores data that can be utilized by the host 802. The memory system 800 and the host 802 can communicate over a host Input/Output (I/O) bus. The host 802 provides a host voltage ($V_H$) (i.e., supply voltage) to the memory system 800. The memory controller 804 couples to the host I/O bus and the host voltage ($V_H$). The memory controller 804 couples to a memory array 806 using an I/O bus and at least one internal supply voltage ($V_{IS}$). The at least one internal supply voltage ($V_{IS}$) is generated by a voltage generation circuit 808 provided within the memory controller 804. Although the embodiment of the memory system 800 shown in FIG. 8 produces the at least one internal supply voltage ($V_{IS}$) at the memory controller 804, it should be understood that the voltage generation circuit 808 can produce any number of a plurality of different supply voltage levels that would be needed by the memory array 806. The voltage generation circuit 808 can correspond to any of the voltage generation circuits discussed herein.

The level of the voltages can vary with implementation. As one example, the host voltage ($V_H$) might be 3.3 or 1.8 volts, and the level of the internal supply voltage ($V_{IS}$) might be 6.5 volts, 15 volts or 30 volts. Moreover, although the voltage generation circuit 808 is illustrated in FIG. 8 as being internal to the memory controller 804, in alternative embodiment, the voltage generation circuit 808 can be (i) internal to the memory array 806 or (ii) separate from either the memory controller 804 or the memory array 806.

The memory array 806 provides an array of data storage elements that provide non-volatile digital data storage. In one embodiment, the data storage elements are electrically programmable and electrically erasable, such as EEPROM or FLASH devices. For example, the data storage elements can be based on floating-gate devices. The memory array 806 can include one or more semiconductor dies, chips or products. The memory array 806 can include data storage elements. The memory controller 804 is also often a separate semiconductor die, chip or product.

As used herein "operatively connected" refers to direct or indirect electrical connection between electrical components.

The various features, aspects, embodiments or implementations can be used alone or in any combination.

The invention can pertain to a memory product that provides data storage. The memory product can, for example, pertain to a semiconductor memory product, such as a semiconductor memory chip or a portable memory card.

The invention can further pertain to an electronic system that includes a memory system as discussed above. A memory system (or memory device) can include at least a memory array that provides data storage. Memory systems (i.e., memory cards) are commonly used to store digital data for use with various electronics products. The memory system is often removable from the electronic system so the stored digital data is portable. The memory systems according to the invention can have a relatively small form factor and be used to store digital data for electronics products (e.g., consumer electronic products) that acquire data, such as cameras, hand-held or notebook computers, network cards, network appliances, set-top boxes, hand-held or other small media (e.g., audio) players/recorders (e.g., MP3 devices), personal digital assistants, mobile telephones, and medical monitors.

The invention is suitable for use with both single-level memories and multi-level memories. The memories or memory blocks are data storage devices that include data storage elements. The data storage elements can be based on semiconductor devices (e.g., floating-gate) or other types of devices. In multi-level memories, each data storage element stores two or more bits of data.

The advantages of the invention are numerous. Different embodiments or implementations may yield one or more of the following advantages. One advantage of the invention is that generation of one or more voltages can be controlled based on an amount of loading. Another advantage of the invention is that undesired voltage overshoots and excessive voltage ripple can be reduced. Still another advantage of the invention is that stable, reliable, high performance memory systems can be obtained.

The many features and advantages of the present invention are apparent from the written description. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A memory device, comprising:
    a voltage generation circuit capable of receiving an input voltage and producing an output voltage, the output voltage being greater than the input voltage;
    a memory array operatively connected to said voltage generation circuit, said memory array including a plurality of non-volatile memory elements; and
    a load monitor operatively connected to said memory array, said load monitor monitoring a load imposed on said voltage generation circuit by said memory array,
    wherein said voltage generation circuit produces the output voltage at a controllable strength, and
    wherein the strength of the output voltage from said voltage generation circuit is limited dependent on the load imposed on said voltage generation circuit by said memory array as monitored by said load monitor.

2. A memory device as recited in claim 1, wherein a maximum strength for the output voltage from said voltage generation circuit is set dependent on the load imposed on said voltage generation circuit by said memory array.

3. A memory device as recited in claim 1, wherein said memory device further comprises:
    a feedback circuit for regulating the output voltage being produced.

4. A memory device as recited in claim 3, wherein said load monitor limits the strength of the output voltage separate from regulation of the output voltage using said feedback circuit.

5. A memory device as recited in claim 1,
    wherein said voltage generation circuit produces the output voltage in accordance with one of a plurality of different strengths, and
    wherein a maximum strength for the output voltage from said voltage generation circuit is set dependent on the load imposed on said voltage generation circuit by said memory array.

6. A memory device as recited in claim 1, wherein the load is proportional to temperature, and
    wherein the load imposed on said voltage generation circuit is dependent on the temperature of said memory array.

7. A memory device as recited in claim 6, wherein the temperature is obtained by at least one temperature sensor internal to said memory array.

8. A memory device as recited in claim 7, wherein the non-volatile memory elements are diode-based memory elements.

9. A memory device as recited in claim 1, wherein the non-volatile memory elements are diode-based memory elements.

10. A memory device as recited in claim 9, wherein said diode-based memory elements are antifuse devices.

11. A memory device as recited in claim 1, wherein at least a plurality of said non-volatile memory elements are memory cells within a plurality of layers of memory cells stacked vertically above one another.

12. A memory device as recited in claim 11, wherein the non-volatile memory elements are diode-based memory elements.

13. A memory device as recited in claim 1, wherein said load monitor receives at least one electrical signal from said memory array, the at least one electrical signal being indicative of the load imposed on said voltage generation circuit by said memory array.

14. A memory device, comprising:
a voltage generation circuit capable of receiving an input voltage and producing an output voltage, the output voltage being greater than the input voltage, said voltage generation circuit including at least
a feedback circuit for regulating the output voltage being produced;
a multi-stage charge pump capable of producing the output voltage; and
a charge pump strength controller configured to control a strength at which the output voltage is produced by said multi-stage charge pump; and
a memory array operatively connected to said voltage generation circuit, said memory array including a plurality of non-volatile memory elements,
wherein said charge pump strength controller receives at least one electrical signal from said memory array, and wherein said charge pump strength controller operates to control the strength at which the output voltage is produced by said multi-stage charge pump based on the electrical signal.

15. A memory device as recited in claim 14, wherein said memory device further comprises:
a temperature sensor to provide a temperature indication.

16. A memory device as recited in claim 15, wherein the temperature indication pertains to a temperature of said memory array.

17. A memory device as recited in claim 15, wherein said temperature sensor is internal to said memory array.

18. A memory device as recited in claim 15, wherein the at least one electrical signal provides the temperature indication from said memory array to said charge pump strength controller, and wherein said charge pump strength controller controls the strength at which the output voltage is produced by said multi-stage charge pump based on the temperature indication.

19. A memory device as recited in claim 18,
wherein said multi-stage charge pump comprises a plurality of stages that are individually selectable, and
wherein said charge pump strength controller operates to control the stages of said multi-state charge pump so that one or more of the stages can be enabled or disabled based on the temperature of said memory array.

20. A memory device as recited in claim 18,
wherein said multi-stage charge pump comprises a voltage-controlled oscillator that produces a clock signal, and
wherein said charge pump strength controller operates to supply a control signal to the voltage-controlled oscillator to influence the frequency of the clock signal based on the temperature of said memory array.

21. A memory device as recited in claim 18, wherein the non-volatile memory elements are diode-based memory elements.

22. An electronic system, comprising:
a data acquisition device; and
a data storage device removably coupled to said data acquisition device, said data storage device storing data acquired by said data acquisition device, and said data storage device including at least:
a voltage generation circuit capable of receiving an input voltage and producing an output voltage, the output voltage being greater than the input voltage;
an array of data storage elements operatively connected to said voltage generation circuit; and
a load monitor operatively connected to said array, said load monitor monitoring a load imposed on said voltage generation circuit by said array,
wherein said voltage generation circuit produces the output voltage at a controllable strength, and
wherein the strength of the output voltage from said voltage generation circuit is limited dependent on the load imposed on said voltage generation circuit by said memory array as monitored by said load monitor.

23. An electronic system as recited in claim 22,
wherein said voltage generation circuit produces the output voltage in accordance with one of a plurality of different strengths, and
wherein the strength of the output voltage from said voltage generation circuit is dependent on the load imposed on said voltage generation circuit by said array of data storage elements.

24. An electronic system as recited in claim 23, wherein the load is proportional to temperature, and
wherein the load imposed on said voltage generation circuit is determined based on the temperature.

25. An electronic system as recited in claim 22, wherein the load is proportional to temperature, and
wherein the load imposed on said voltage generation circuit is dependent on the temperature of said array of data storage elements.

26. An electronic system as recited in claim 25, wherein the temperature is obtained by at least one temperature sensor internal to said array of data storage elements.

27. An electronic system as recited in claim 26, wherein the data storage elements are diode-based memory elements.

28. An electronic system as recited in claim 22, wherein at least a plurality of the data storage elements are memory cells within a plurality of layers of memory cells stacked vertically above one another.

29. An electronic system as recited in claim 28, wherein the data storage elements are diode-based memory elements.

30. An electronic system as recited in claim 29,
wherein the data storage elements are non-volatile memory elements, and
wherein said array of data storage elements includes a plurality of layers of memory cells stacked vertically above one another in a single chip.

31. An electronic system as recited in claim 22, wherein said data acquisition device is one of a camera, a network card or appliance, a hand-held or notebook computer, a set-top box, a hand-held or other small media player/recorder, personal digital assistant, mobile telephone, and a medical monitor.

32. An electronic system as recited in claim 22, wherein said load monitor receives at least one electrical signal from said array, the at least one electrical signal being indicative of the load imposed on said voltage generation circuit by said array.

* * * * *